United States Patent
Song et al.

(10) Patent No.: US 10,191,367 B2
(45) Date of Patent: Jan. 29, 2019

(54) PELLICLE FOR PHOTOMASK AND EXPOSURE APPARATUS INCLUDING THE PELLICLE

(71) Applicant: Samsung Electronics Co., Ltd., Suwon-si, Gyeonggi-do (KR)

(72) Inventors: Hyunjae Song, Hwaseong-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 15/403,446

(22) Filed: Jan. 11, 2017

(65) Prior Publication Data

US 2018/0004082 A1 Jan. 4, 2018

(30) Foreign Application Priority Data

Jun. 30, 2016 (KR) .................. 10-2016-0082967

(51) Int. Cl.
| | |
|---|---|
| *G03B 27/42* | (2006.01) |
| *G03F 1/62* | (2012.01) |
| *G03F 1/64* | (2012.01) |
| *G03F 1/48* | (2012.01) |
| *G03F 7/20* | (2006.01) |
| *G03F 1/22* | (2012.01) |

(52) U.S. Cl.
CPC .................. *G03F 1/62* (2013.01); *G03F 1/22* (2013.01); *G03F 1/48* (2013.01); *G03F 1/64* (2013.01); *G03F 7/70058* (2013.01)

(58) Field of Classification Search
CPC ........ G03F 1/62; G03F 7/70983; G03F 1/142; G03F 1/24; G03F 7/2002; G03F 7/70916; G03F 1/66
See application file for complete search history.

(56) References Cited

U.S. PATENT DOCUMENTS

| | | | |
|---|---|---|---|
| 2002/0181092 A1* | 12/2002 | Wang ................. | G03F 1/62 359/350 |
| 2011/0281221 A1 | 11/2011 | Chen et al. | |
| 2012/0182538 A1 | 7/2012 | Koole et al. | |

(Continued)

FOREIGN PATENT DOCUMENTS

| | | |
|---|---|---|
| EP | 3151064 A2 | 4/2017 |
| JP | 2002/049145 A | 2/2002 |

(Continued)

OTHER PUBLICATIONS

Korean Office Action dated May 8, 2017 issued in corresponding Korean Application No. 10-2016-0082967 (English translation provided).

(Continued)

*Primary Examiner* — Mesfin Asfaw
(74) *Attorney, Agent, or Firm* — Harness, Dickey & Pierce, P.L.C.

(57) ABSTRACT

Provided are a pellicle for a photomask, which protects the photomask from external contamination and an exposure apparatus including the pellicle for the photomask. The pellicle for the photomask includes a pellicle membrane provided spaced apart from the photomask. The pellicle membrane includes a semiconductor having a two-dimensional (2D) crystalline structure.

22 Claims, 7 Drawing Sheets

(56) References Cited

U.S. PATENT DOCUMENTS

| | | | |
|---|---|---|---|
| 2012/0183757 A1* | 7/2012 | Akiyama | B82Y 10/00 |
| | | | 428/216 |
| 2013/0029253 A1* | 1/2013 | Mangat | G03F 1/22 |
| | | | 430/5 |
| 2013/0250260 A1 | 9/2013 | Singh | |
| 2016/0078608 A1 | 3/2016 | Na et al. | |
| 2016/0139500 A1* | 5/2016 | Kim | G03F 1/62 |
| | | | 430/5 |
| 2017/0090278 A1* | 3/2017 | Chiu | G03F 1/62 |

FOREIGN PATENT DOCUMENTS

| | | |
|---|---|---|
| KR | 2011-0029005 A | 3/2011 |
| KR | 20130088565 A | 8/2013 |
| KR | 2016-0058306 A | 5/2016 |
| WO | WO-2005/029180 A2 | 3/2005 |
| WO | WO-2011/160861 A1 | 12/2011 |
| WO | WO-2017/067813 A2 | 4/2017 |

OTHER PUBLICATIONS

European Extended Search Report dated Oct. 9, 2017 issued in corresponding European Application No. 17162100.6.

* cited by examiner

PELLICLE FOR PHOTOMASK AND EXPOSURE APPARATUS INCLUDING THE PELLICLE

CROSS-REFERENCE TO RELATED APPLICATION

This application claims the benefit of Korean Patent Application No. 10-2016-0082967, filed on Jun. 30, 2016, in the Korean Intellectual Property Office, the disclosure of which is incorporated herein in its entirety by reference.

BACKGROUND

Example embodiments relate to a pellicle for a photomask, which protects the photomask from external contamination and an exposure apparatus including the pellicle for the photomask.

SUMMARY

Example embodiments include a pellicle for a photomask, which protects the photomask from external contamination, and an exposure apparatus including the pellicle for the photomask.

Additional example embodiments of the inventive concepts will be set forth in part in the description which follows and, in part, will be apparent from the description, or may be learned by practice of the presented embodiments.

According to example embodiments of the inventive concepts, there is provided a pellicle for a photomask, which protects the photomask from external contamination, the pellicle including a pellicle membrane which is provided spaced apart from the photomask and includes a semiconductor having a two-dimensional (2D) crystalline structure.

The semiconductor having the 2D crystalline structure may include transition metal dichalcogenide (TMD). The TMD may include a metal element selected from a group including Mo, W, Nb, V, Ta, Ti, Zr, Hf, Tc, Re, Cu, Ga, In, Sn, Ge, and Pb and a chalcogen element selected from a group including S, Se, and Te.

A surface roughness of the pellicle membrane may be less than several nanometers, for example less than 10 nm. A thickness of the pellicle membrane may be about 1 nm to about 50 nm.

A light transmittance of the pellicle membrane may be greater than or equal to about 90%.

The pellicle may further include a frame provided at an edge portion of the photomask to support the pellicle membrane. An adhesive layer may be further provided between the pellicle membrane and the frame.

The pellicle may further include a protective layer provided at least a surface of the pellicle membrane. The protective layer may include at least one of a carbon-based material and a transition metal dichalcogenide (TMD). Here, the carbon-based material may include, for example, at least one of amorphous carbon, graphene, nano graphite, carbon nanosheet, carbon nanotube, SiC, and B4C.

According to another example embodiments of the inventive concepts, there is provided a reticle including a photomask and a pellicle configured to protect the photomask from external contamination, in which the pellicle includes a pellicle membrane, which is provided spaced apart from the photomask and includes a semiconductor having a two-dimensional (2D) crystalline structure.

The semiconductor having the 2D crystalline structure may include transition metal dichalcogenide (TMD).

The pellicle may further include a frame provided at an edge portion of the photomask to support the pellicle membrane. An adhesive layer may be further provided between the pellicle membrane and the frame.

The pellicle may further include a protective layer provided at least a surface of the pellicle membrane.

The photomask may include a reflective layer and an adsorptive pattern provided on the reflective layer.

According to other example embodiments of the inventive concepts, there is provided an exposure apparatus including a light source configured to emit light of an extreme ultraviolet (EUV) spectrum, a photomask configured to perform an exposure process by using light emitted from the light source, and a pellicle configured to protect the photomask from external contamination, in which the pellicle includes a pellicle membrane, which is provided spaced apart from the photomask and includes a semiconductor having a two-dimensional (2D) crystalline structure.

The semiconductor having the 2D crystalline structure may include transition metal dichalcogenide (TMD).

The pellicle may further include a protective layer provided at least a surface of the pellicle membrane.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
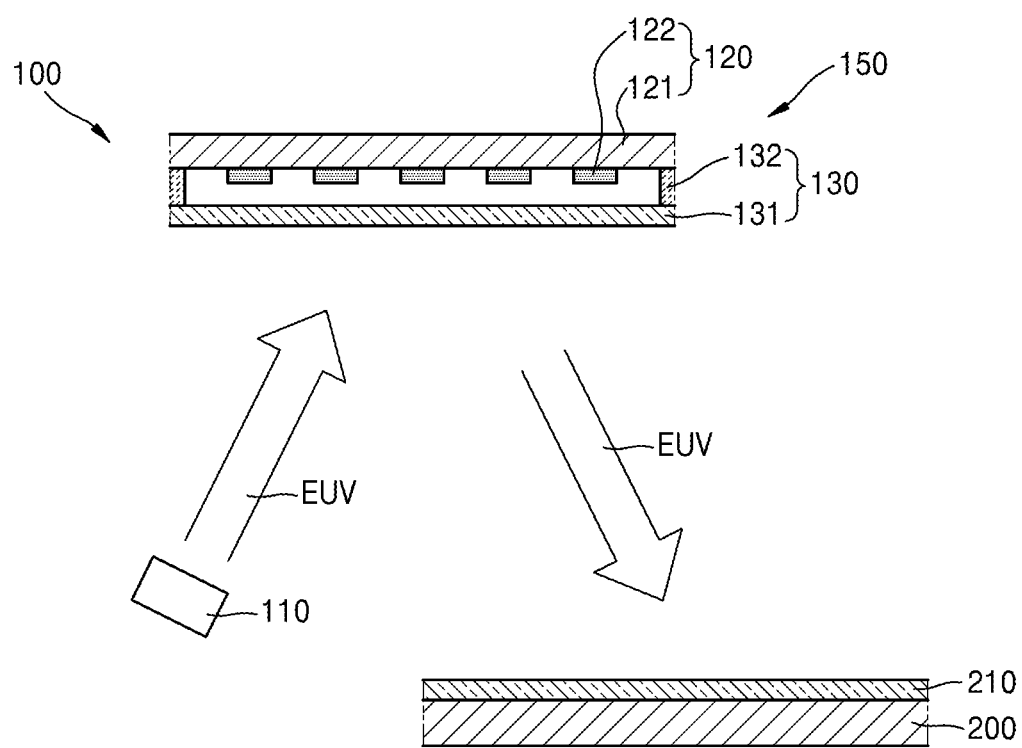
FIG. 1 schematically illustrates an exposure apparatus according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described with reference to the accompanying drawings. Throughout the drawings, like reference numerals refer to like elements, and each element may be exaggerated in size for clarity and convenience of a description. When it is described that a material layer exists in a substrate or another layer, the material layer may exist in directly contact with the substrate or the another layer or another third layer may exist between them. In the following embodiments, a material forming each layer is an example, and thus other materials may also be used for the layer.

Figure 2:
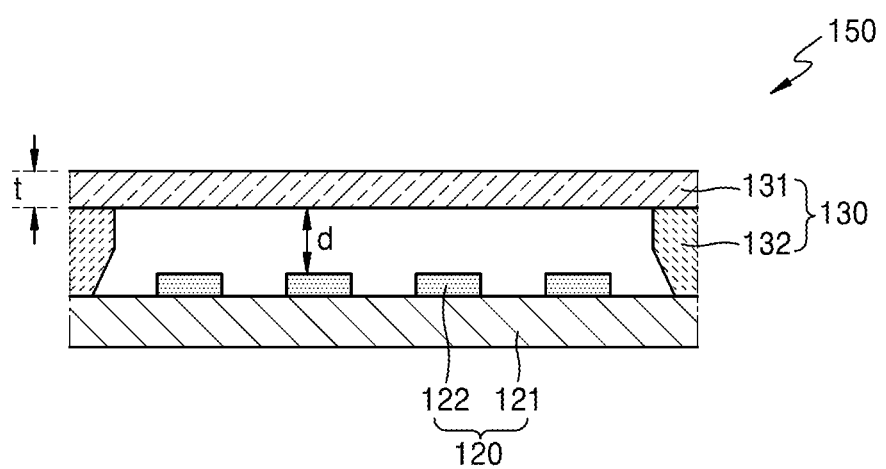
FIG. 2 illustrates a reticle of an exposure apparatus illustrated in FIG. 1.

FIG. 1 schematically illustrates an exposure apparatus 100 according to an example embodiment. FIG. 2 is an enlarged view of a reticle 150 of the exposure apparatus 100 illustrated in FIG. 1.

Referring to FIG. 1, the exposure apparatus 100 may be used for photo lithography and pattern a resist layer 210 formed on a substrate 200 by using energy in the form of a beam, for example, light having a specific wavelength. The exposure apparatus 100 may include a light source 110, a photomask 120 performing an exposure operation on the resist layer 210 by using light exposed from the light source 110, and a pellicle 130 for protecting the photomask 120.

The light source 110 may emit light of a short wavelength region for forming a fine pattern on the resist layer 210. More specifically, the light source 110 may emit light of an extreme ultraviolet (EUV) spectrum having a wavelength of about 13.3 nm.

The light in the EUV region emitted from the light source 110 may be incident to the reticle 150. Here, the reticle 150 means a structure in which the photomask 120 and the pellicle 130 are coupled. Although not shown in the drawings, on a light path between the light source 110 and the reticle 150, an optical system such as a collimating lens or the like may be further provided to allow the light in the EUV spectrum emitted from the light source 110 to be uniformly incident to the reticle 150.

The reticle 150 may include the photomask 120 and the pellicle 130 provided on the photomask 120. The photomask 120 exposes the light in the EUV spectrum emitted from the light source 110 to the resist layer 210 formed on the substrate 200. The photomask 120 may include a mask substrate 121 and a mask pattern 122 provided in a predetermined form on a surface of the mask substrate 121. The pellicle 130 is provided on the mask substrate 121 to cover the mask pattern 122.

The photomask 120 may also include a reflective type photomask. In this case, the light in the EUV spectrum emitted from the light source 101 passes through the pellicle 130 and is incident to the photomask 120, and the light in the EUV spectrum reflected from the photomask 120 passes through the pellicle 130 and is incident to the resist layer 210 of the substrate 200. Here, the mask substrate 121 may include a reflective layer for reflecting the light in the EUV spectrum, and the mask pattern 122 may include an absorption pattern for absorbing the light in the EUV spectrum. Although not shown in the drawings, on a light path between the reticle 150 and the resist layer 210, an optical system such as a focusing lens and/or other optical components may be further provided to collect the light in the EUV spectrum emitted from the reticle 150.

The pellicle 130 is provided on the photomask 120 to protect the photomask 120 by preventing, or reducing the likelihood of, external contaminants such as a dust or resist from contaminating the photomask 120. To this end, the pellicle 130 may include a pellicle membrane 131 provided spaced apart by a predetermined distance from the photomask 120. The pellicle membrane 131 may be provided spaced apart by about several mms from the photomask 120. For example, a distance d between the pellicle membrane 131 and the photomask 120 may be about 1 mm-about 10 mm. To be more specific, the distance d between the pellicle membrane 131 and the photomask 120 may be about 5 mm-about 10 mm. However, the distance d is not limited.

The pellicle membrane 131 for protecting the photomask 120 should have a high transmittance with respect to the light emitted from the light source 110, i.e., the light in the EUV spectrum, and have a surface roughness being less than a desired, or alternatively specific level. The pellicle membrane 131 should have superior physical and chemical durability to reduce damage by exposure to the light in the EUV spectrum for a specific time, or by surface cleaning.

In the current example embodiment, the pellicle membrane 131 may include a semiconductor material having a two-dimensional (2D) crystalline structure. For example, the pellicle membrane 131 may include transition metal dichalcogenide (TMD). The TMD is a 2D material having excellent thermal stability and mechanical strength and high thermal conductivity. Here, the pellicle membrane 131 may have a TMD multi-layer structure in which TMD of each layer may have a thickness corresponding to an atomic monolayer or so.

The TMD may include a transition metal including at least one of Mo, W, Nb, V, Ta, Ti, Zr, Hf, Tc, and Re, and a chalcogen element including at least one of S, Se, and Te. The TMD may be expressed as, for example, $MX_2$, where M indicates the transition metal and X indicates the chalcogen element. The M may be Mo, W, Nb, V, Ta, Ti, Zr, Hf, Tc, Re, or the like, and the X may be S, Se, Te, or the like. In this case, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or the like. Alternatively, the TMD may not be expressed with $MX_2$. In this case, for example, the TMD may include a compound CuS of the transition metal Cu and the chalcogen element S. The TMD may be chalcogenide material including non-transition metal. The non-transition metal may include, e.g., Ga, In, Sn, Ge, Pb, or the like. In this case, the TMD may include a compound of non-transition metal such as Ga, In, Sn, Ge, Pb, etc., and the chalcogen element such as S, Se, Te, etc. For example, the TMD may include $SnSe_2$, GaS, GaSe, GaTe, GeSe, $In_2Se_3$, $InSnS_2$, or the like.

The TMD may include a metal element including at least one of Mo, W, Nb, V, Ta, Ti, Zr, Hf, Tc, Re, Cu, Ga, In, Sn, Ge, and Pb, and a chalcogen element including at least one of S, Se, and Te. However, the aforementioned materials are merely examples, and other materials may also be used as TMD materials. The TMD may be formed, for example, by chemical vapor deposition (CVD), physical vapor deposition (PVD), catalyst growth, exfoliation, and/or similar processes.

The TMD may be doped with a dopant such as a p-type dopant, an n-type dopant, or neutral dopants. However, the p-type dopant or the n-type dopant may be doped using ion implantation or chemical doping. A source of the p-type dopant may include, for example, ionic liquid such as $NO_2BF_4$, $NOBF_4$, $NO_2SbF_6$, etc., an acidic compound such as HCl, $H_2PO_4$, $CH_3COOH$, $H_2SO_4$, $HNO_3$, etc., and an organic compound such as dichlorodicyanoquinone (DDQ), oxone, dimyristoylphosphatidylinositol (DMPI), trifluoromethanesulfoneimide, etc. Alternatively, the source of the p-type dopant may include, for example, $HPtCl_4$, $AuCl_3$, $HAuCl_4$, AgOTf (silver trifluoromethanesulfonate), $AgNO_3$, $H_2PdCl_6$, $Pd(OAc)_2$, $Cu(CN)_2$, or the like.

A source of the n-type dopant may include, for example, a reduction product of a substituted or unsubstituted nicotinamide, a reduction product of a compound which is chemically bound to a substituted or unsubstituted nicotinamide, and a compound comprising at least two pyridinium moieties in which a nitrogen atom of at least one of the pyridinium moieties is reduced. For example, the source of the n-type dopant may include nicotinamide mononucleotide-H (NMNH), and nicotinamide adenine dinucleotide-H (NADH), or viologen. The source of the n-type dopant may include a polymer such as polyethylenimine (PEI) or the like. The n-type dopant may also include alkali metal such as K, Li, etc. The aforementioned p-type dopant and n-type dopant materials are examples, and various other materials may be used for the dopants.

The pellicle membrane 131 including the above-described TMD may have a high light transmittance of about 90% or higher with respect to the light in the EUV spectrum. The pellicle membrane 131 including the TMD may have a thickness t of about 1 nm to about 50 nm. However, the thickness t is not limited to this example, and may vary according to designing conditions. The pellicle membrane 131 including the TMD may have a uniform surface having a surface roughness being less than several nanometers. The pellicle membrane 131 including the TMD may have have superior physical and chemical durability enough not to be damaged by exposure to the light in the EUV spectrum for a specific time or by surface cleaning.

A frame 132 may be provided between the pellicle membrane 131 and the photomask 120. Here, the frame 132 is provided at an edge of the photomask 120 to support the pellicle membrane 131 in such a way that the pellicle membrane 131 is spaced apart from the photomask 120 by the specific distance d.

In the exposure apparatus 100 structured as described above, the light in the EUV spectrum emitted from the light source 110 is incident to the photomask 120 after passing through the pellicle 130 (more specifically, the pellicle membrane 131), and the light in the EUV spectrum reflected from the photomask 120 is incident to the resist layer 210 formed on the substrate 200 after passing through the pellicle 130 (more specifically, the pellicle membrane 131), such that an exposure process is performed.

In the current example embodiments, the pellicle membrane 131 includes TMD, which is a semiconductor material having a 2D crystalline structure, thus having superior physical and chemical durability. Thus, the pellicle membrane 131 may not be damaged by exposure to the light in the EUV spectrum for a predetermined time. Further, the pellicle may not be damaged by surface cleaning. The pellicle membrane 131 including the TMD may have a high light transmittance over about 90% with respect to the light in the EUV spectrum and have a uniform surface having a surface roughness being less than several nanometers. The pellicle membrane 131 including the TMD has excellent heat dissipation characteristics because of high thermal conductivity, thus preventing, or reducing the likelihood of, thermal damage caused by the light in the EUV spectrum.

In the exposure apparatus 100 illustrated in FIG. 1, for example, a reflective type photomask is used as the photomask 120. However, without being limited to the foregoing example, the photomask 120 may use a transmissive type photomask. In this case, the mask substrate 121 may include a transmissive layer for passing incident light therethrough, and the mask pattern 122 may include an absorption pattern for absorbing the incident light.

Figure 3:
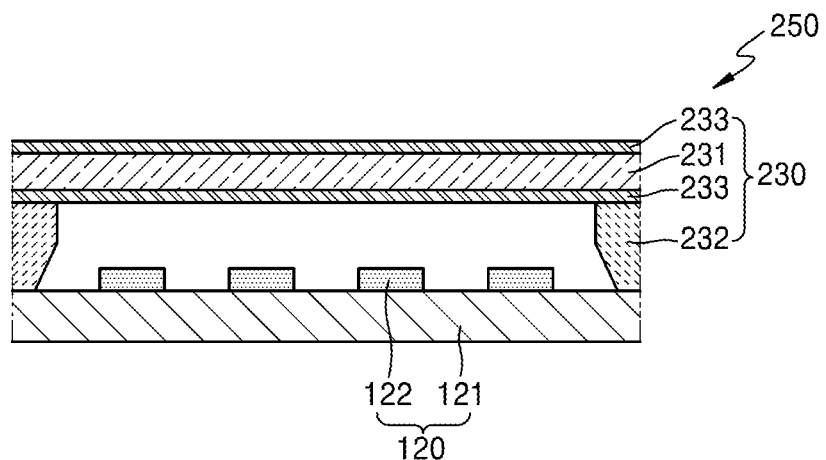
FIG. 3 illustrates a reticle of an exposure apparatus according to another exemplary embodiment.

FIG. 3 illustrates a reticle 250 of an exposure apparatus according to another example embodiment.

Referring to FIG. 3, the reticle 250 may include the photomask 120 and a pellicle 230 for protecting the photomask 120. The photomask 120 exposes light of an EUV spectrum emitted from a light source (110 of FIG. 1) to a resist layer 210 formed on a substrate 200, and may include the mask substrate 121 and the mask pattern 122 provided in a predetermined form on a surface of the mask substrate 121. Here, the mask substrate 121 may include a reflective layer for reflecting the light in the EUV spectrum, and the mask pattern 122 may include an absorption pattern for absorbing the light in the EUV spectrum. However, embodiments of the inventive concepts are not limited to this example embodiment.

The pellicle 230 is provided on the mask substrate 121 covering the mask pattern 122. The pellicle 230 protects the photomask 120 by preventing, or reducing the likelihood of, external contaminants such as a dust or resist from contaminating the photomask 120.

The pellicle 230 may include a pellicle membrane 231 and protective layers 233 provided on opposite surfaces of the pellicle membrane 231. The pellicle membrane 231 may be provided spaced apart by a predetermined distance from the photomask 120. For example, a distance between the pellicle membrane 231 and the photomask 120 may be, but not limited to, about 1 mm-about 10 mm.

The pellicle membrane 231 may include a semiconductor material having a 2D crystalline structure. More specifically, the pellicle membrane 131 may include TMD. The TMD may include a metal element including at least one of Mo, W, Nb, V, Ta, Ti, Zr, Hf, Tc, Re, Cu, Ga, In, Sn, Ge, and Pb, and a chalcogen element including at least one of S, Se, and Te. However, the aforementioned materials are merely examples, and other materials may also be used as TMD materials. The TMD may be formed, for example, by CVD, PVD, catalyst growth, exfoliation, or the like. The TMD may be doped with a p-type dopant or an n-type dopant.

Once the pellicle membrane 231 is including the TMD, the pellicle membrane 231 may have high physical and chemical durability and high light transmittance. The pellicle membrane 231 including the TMD may have a surface roughness being less than several nanometers, and may have improved heat dissipation characteristics due to high thermal conductivity.

The protective layers 233 are formed on the opposite surfaces of the pellicle membrane 231. The protective layers 233 reinforce durability of the pellicle membrane 231 during an exposure process by using the light in the EUV spectrum and minimize deformation of the pellicle membrane 231, which may be caused by heat accumulation.

The protective layers 233 may include at least one of a carbon-based material and the TMD. Here, the carbon-based material may include, for example, at least one of amorphous carbon, graphene, nano graphite, carbon nanosheet, carbon nanotube, SiC, and B4C. The TMD may include a metal element including at least one of Mo, W, Nb, V, Ta, Ti, Zr, Hf, Tc, Re, Cu, Ga, In, Sn, Ge, Pb, and a chalcogen element including at least one of S, Se, and Te.

The pellicle membrane 231 and the protective layers 233 may include different TMD materials. However, the inventive concepts are not limited to the foregoing example, and the pellicle membrane 231 and the protective layers 233 may include an identical TMD material.

In this way, when the protective layers 233 are formed on the opposite surfaces of the pellicle membrane 231, the protective layers 233 may have a surface roughness that is similar with that of the pellicle membrane 231. For example, the protective layers 233 may have a surface roughness being less than several nanometers.

A frame 232 may be provided between the protective layers 233 formed in the pellicle membrane 231 and the photomask 120. The frame 232 may be provided at an edge of the photomask 120 to support the pellicle membrane 231 and the protective layers 233.

In the reticle 250 for the exposure apparatus 100 structured as described above, the pellicle membrane 231 includes the TMD, thereby implementing high physical and chemical durability and high light transmittance. The pellicle membrane 231 including the TMD may have a uniform surface roughness being less than several nanometers, and may have improved heat dissipation characteristics due to high thermal conductivity. As the protective layers 233 are formed on the opposite surfaces of the pellicle membrane 231, the durability of the pellicle membrane 231 may be further improved and deformation of the pellicle membrane 231 caused by heat accumulation may be minimized.

A description has been made so far regarding a case where the protective layers 233 are formed on the opposite surfaces of the pellicle membrane 231. However, a protective layer may also be formed on one surface of the pellicle membrane 231.

Figure 4A:
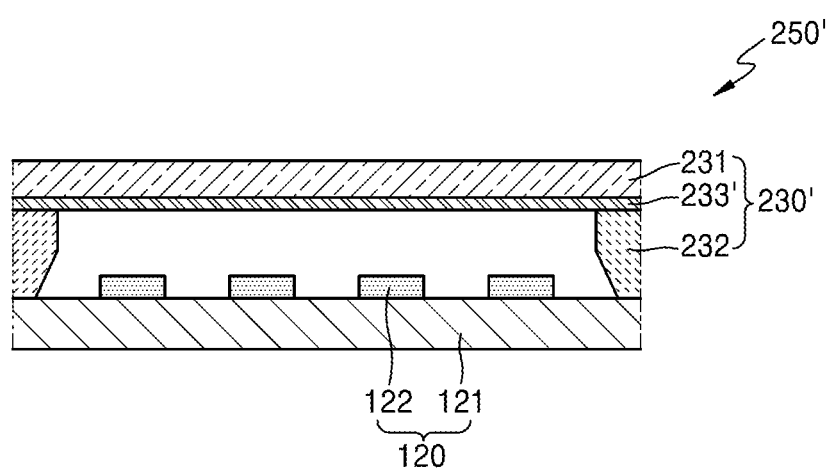
FIGS. 4A and 4B illustrate modified examples of a reticle of an exposure apparatus illustrated in FIG. 3.
Figure 4B:
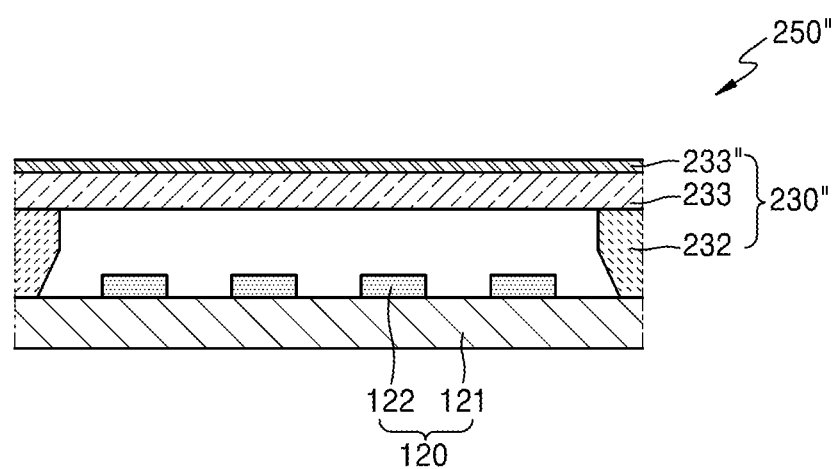

FIGS. 4A and 4B illustrate modified examples of reticle 250' and 250" of the exposure apparatus illustrated in FIG. 3. In the reticle 250' illustrated in FIG. 4A, a protective layer 233' is formed on a bottom surface of the pellicle membrane 231. In the reticle 250" illustrated in FIG. 4B, a protective layer 233" is formed on a top surface of the pellicle membrane 231. The protective layers 233' and 233" function in the same manner as the protective layers 233 illustrated in FIG. 3, and thus will not be described in detail.

Figure 5:
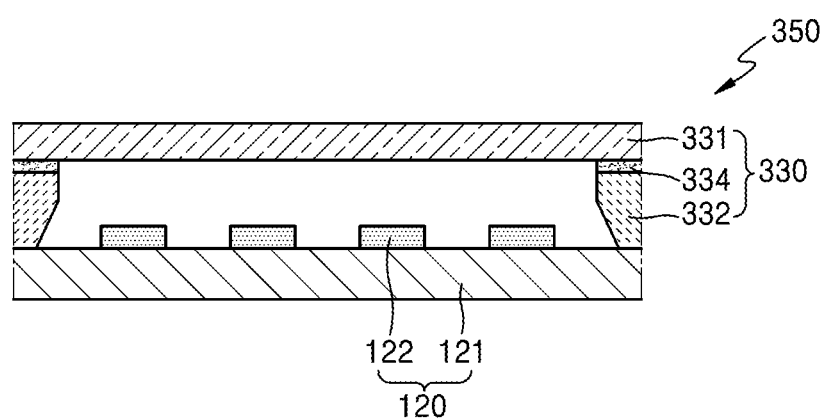
FIG. 5 illustrates a reticle of an exposure apparatus according to another example embodiment of the inventive concepts.

FIG. 5 illustrates a reticle 350 of an exposure apparatus according to another example embodiment.

Referring to FIG. 5, the reticle 350 may include the photomask 120 and a pellicle 330 for protecting the photomask 120. The photomask 120 may further include a mask substrate 121 and a mask pattern 122 provided in a predetermined form on a surface of the mask substrate 121.

The pellicle 330 is provided on the mask substrate 121 to cover the mask pattern 122. The pellicle 330 may include a pellicle membrane 331 provided spaced apart by a predetermined distance from the photomask 120. For example, a distance between the pellicle membrane 331 and the photomask 120 may be, but not limited to, about 1 mm-about 10 mm.

The pellicle membrane 331 may include a semiconductor material having a 2D crystalline structure. More specifically, the pellicle membrane 331 may include TMD. The TMD may include a metal element including at least one of Mo, W, Nb, V, Ta, Ti, Zr, Hf, Tc, Re, Cu, Ga, In, Sn, Ge, and Pb, and a chalcogen element including at least one of S, Se, and Te. However, the aforementioned materials are merely examples, and other materials may also be used as TMD materials.

Once the pellicle membrane 331 is formed using the TMD, the pellicle membrane 331 may have high physical and chemical durability and high light transmittance. The pellicle membrane 331 may have a surface roughness being less than several nanometers, and may have improved heat dissipation characteristics due to high thermal conductivity.

A frame 332 may be provided between the pellicle membrane 331 and the photomask 120. The frame 332 is provided at an edge of the photomask 120 to support the pellicle membrane 331. An adhesive layer 334 may be further provided between the pellicle membrane 331 and the frame 332. The adhesive layer 334 more firmly bonds the pellicle membrane 331 and the frame 332, thereby improving the durability of the pellicle 330.

In the reticle 350 for the exposure apparatus 100 structured as described above, the pellicle membrane 331 is formed using the TMD, thereby implementing high physical and chemical durability and high light transmittance. The pellicle membrane 331 including the TMD may have a uniform surface roughness being less than several nanometers, and may have improved heat dissipation characteristics due to high thermal conductivity. As the adhesive layer 334 is provided between the pellicle membrane 331 and the frame 332, the durability of the pellicle 330 may be further improved.

Figure 6:
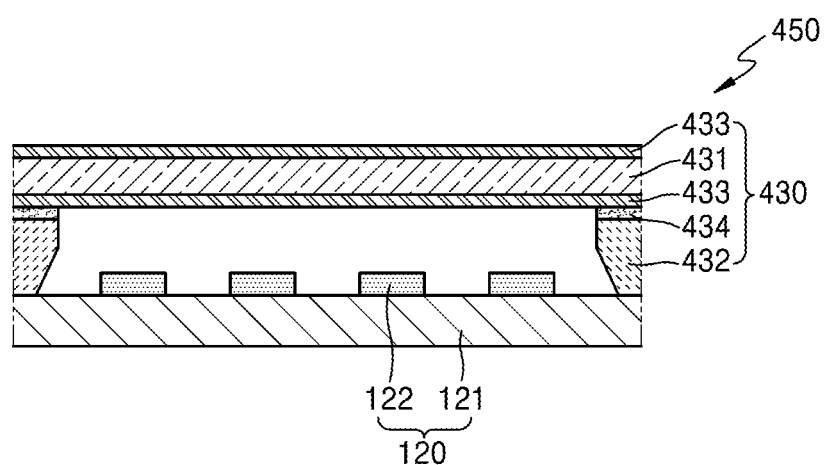
FIG. 6 illustrates a reticle of an exposure apparatus according to another example embodiment of the inventive concepts.

FIG. 6 illustrates a reticle 450 of an exposure apparatus according to another example embodiment.

Referring to FIG. 6, the reticle 450 may include the photomask 120 and a pellicle 430 for protecting the photomask 120. The photomask 120 may further include a mask substrate 121 and a mask pattern 122 provided in a predetermined form on a surface of the mask substrate 121.

The pellicle 430 is provided on the mask substrate 121 to cover the mask pattern 122. The pellicle 430 may include a pellicle membrane 431 and protective layers 433 provided on opposite surfaces of the pellicle membrane 431. The pellicle membrane 431 may be provided spaced apart by a predetermined distance from the photomask 120. For example, a distance between the pellicle membrane 431 and the photomask 120 may be, but not limited to, about 1 mm-about 10 mm.

The pellicle membrane 431 may include a semiconductor material having a 2D crystalline structure. More specifically, the pellicle membrane 431 may include TMD. The TMD may include a metal element including at least one of Mo, W, Nb, V, Ta, Ti, Zr, Hf, Tc, Re, Cu, Ga, In, Sn, Ge, and Pb, and a chalcogen element including at least one of S, Se, and Te. However, the aforementioned materials are merely examples, and other materials may also be used as TMD materials.

Once the pellicle membrane 431 is including the TMD, the pellicle membrane 431 may have high physical and chemical durability and high light transmittance. The pellicle membrane 431 formed using the TMD may have a surface roughness being less than several nanometers, and may have improved heat dissipation characteristics due to high thermal conductivity.

The protective layers 433 are formed on the opposite surfaces of the pellicle membrane 431. The protective layers 433 reinforce durability of the pellicle membrane 431 during an exposure process by using the light in the EUV spectrum and minimize deformation of the pellicle membrane 431, which may be caused by heat accumulation. The protective layers 433 may include at least one of a carbon-based material and the TMD. Here, the carbon-based material may include, for example, at least one of amorphous carbon, graphene, nano graphite, carbon nanosheet, carbon nanotube, SiC, and B4C. In FIG. 6, the protective layers 433 are formed on the opposite surfaces of the pellicle membrane 431, respectively. However, without being limited to this example, the protective layer 433 may be formed on a surface of the pellicle membrane 431. In this way, when the protective layers 433 are formed on at least a surface of the pellicle membrane 431, the protective layers 433 may have a surface roughness that is similar with that of the pellicle membrane 431.

A frame 432 may be provided between the protective layers 233 formed in the pellicle membrane 431 and the photomask 120. The frame 432 is provided at an edge of the photomask 120 to support the pellicle membrane 431 and the protective layers 433. An adhesive layer 434 may be provided between the protective layers 433 formed in the pellicle membrane 431 and the frame 432. The adhesive layer 434 more firmly bonds the protective layers 433 and the frame 432, thereby improving the durability of the pellicle 430.

In the reticle 450 for the exposure apparatus 100 structured as described above, the pellicle membrane 431 is including the TMD, thereby implementing high physical and chemical durability and high light transmittance. The pellicle membrane 431 including the TMD may have a uniform surface roughness being less than several nanometers, and may have improved heat dissipation characteristics due to high thermal conductivity. As the protective layers 433 are formed on at least a surface of the pellicle membrane 431, the durability of the pellicle membrane 431 may be further improved and deformation of the pellicle membrane 431 caused by heat accumulation may be minimized. As the adhesive layer 434 is provided between the protective layers 433 formed in the pellicle membrane 431 and the frame 432, the durability of the pellicle 430 may be further improved.

According to example embodiments, the pellicle membrane that protects the photomask from an external contaminant may include TMD which is a semiconductor material having a 2D crystalline structure. Thus, the pellicle membrane may have have superior physical and chemical durability enough not to be damaged by exposure to the light in the EUV spectrum for a specific time or by surface cleaning. Moreover, the pellicle membrane including the TMD may have a high light transmittance over about 90% with respect to the light in the EUV spectrum and have a uniform surface having a surface roughness being less than several nanometers. In addition, the pellicle membrane including the TMD has excellent heat dissipation characteristics because of high thermal conductivity, thus preventing, or reducing the likelihood of, thermal damage caused by the light in the EUV spectrum. Furthermore, by forming protective layers on at least a surface of the pellicle membrane, the durability of the pellicle membrane may be further improved, and deformation of the pellicle membrane caused by heat accumulation may be minimized, thereby lengthening the lifespan of the pellicle.

It should be understood that example embodiments described herein should be considered in a descriptive sense only and not for purposes of limitation. Other example embodiments are apparent to one of ordinary skill in the art. For example, the pellicle 430 may include a pellicle membrane 431, an adhesive layer 434, and a protective layer 433 provided on one surface of the pellicle membrane 431. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A pellicle for a photomask, which protects the photomask from external contamination, the pellicle comprising:
a pellicle membrane spaced apart from the photomask; the pellicle membrane including a semiconductor having a two-dimensional (2D) crystalline structure, the pellicle membrane further including at least one of an n-type dopant and a p-type dopant.

2. The pellicle of claim 1, wherein the semiconductor having the 2D crystalline structure includes transition metal dichalcogenide (TMD).

3. The pellicle of claim 2, wherein the TMD comprises a metal element including at least one of Mo, W, Nb, V, Ta, Ti, Zr, Hf, Tc, Re, Cu, Ga, In, Sn, Ge, and Pb and a chalcogen element including at least one of S, Se, and Te.

4. The pellicle of claim 1, wherein a surface roughness of the pellicle membrane is less than ten nanometers.

5. The pellicle of claim 1, wherein a thickness of the pellicle membrane is about 1 nm to about 50 nm.

6. The pellicle of claim 1, wherein a light transmittance of the pellicle membrane is greater than or equal to 90%.

7. The pellicle of claim 1, further comprising a frame at an edge portion of the photomask, the frame configured to support the pellicle membrane.

8. The pellicle of claim 7, further comprising an adhesive layer between the pellicle membrane and the frame.

9. The pellicle of claim 1, further comprising a protective layer on at least a surface of the pellicle membrane.

10. The pellicle of claim 9, wherein the protective layer includes at least one of a carbon-based material and a transition metal dichalcogenide (TMD).

11. The pellicle of claim 10, wherein the carbon-based material includes at least one of amorphous carbon, graphene, nano graphite, carbon nanosheet, carbon nanotube, and B4C.

12. A reticle comprising:
a photomask; and
a pellicle configured to protect the photomask from external contamination,
wherein the pellicle includes a pellicle membrane, the pellicle membrane being spaced apart from the photomask, the pellicle membrane including a semiconductor having a two-dimensional (2D) crystalline structure, the pellicle membrane further including at least one of an n-type dopant and a p-type dopant.

13. The reticle of claim 12, wherein the semiconductor having the 2D crystalline structure includes transition metal dichalcogenide (TMD).

14. The reticle of claim 12, wherein the pellicle further comprises a frame at an edge portion of the photomask configured to support the pellicle membrane.

15. The reticle of claim 14, wherein the pellicle further includes an adhesive layer between the pellicle membrane and the frame.

16. The reticle of claim 12, wherein the pellicle further comprises a protective layer at least a surface of the pellicle membrane.

17. The reticle of claim 12, wherein the photomask includes a reflective layer and an adsorptive pattern provided on the reflective layer.

18. An exposure apparatus comprising:
a light source configured to emit light;
a photomask configured to perform an exposure process by using light emitted from the light source; and
a pellicle configured to protect the photomask from external contamination,
wherein the pellicle includes a pellicle membrane, spaced apart from the photomask and includes a semiconductor having a two-dimensional (2D) crystalline structure, the pellicle membrane further including at least one of an n-type dopant and a p-type dopant.

19. The exposure apparatus of claim 18, wherein the semiconductor having the 2D crystalline structure comprises transition metal dichalcogenide (TMD).

20. The exposure apparatus of claim 18, wherein the pellicle further includes a protective layer provided at least a surface of the pellicle membrane.

21. The exposure apparatus of claim 18, wherein the light is from the extreme ultraviolet (EUV) spectrum.

22. An exposure apparatus comprising:
a beam source configured to emit a beam;
a mask configured to perform an exposure process by using the beam emitted from the beam source; and
a pellicle configured to protect the mask from external contamination; the pellicle including a pellicle membrane spaced apart from the mask, the pellicle membrane including a semiconductor having a two-dimensional (2D) crystalline structure, the pellicle membrane further including at least one of an n-type dopant and a p-type dopant.

* * * * *